United States Patent [19]

Han

[11] Patent Number: 5,607,871
[45] Date of Patent: Mar. 4, 1997

[54] METHOD OF MANUFACTURING A FLASH EEPROM CELL USING THE SELECT GATES AS A MASK

[75] Inventor: Sung O. Han, Kyungki-Do, Rep. of Korea

[73] Assignee: Hyundai Electronic Industries Co., Ltd., Kyungki-do, Rep. of Korea

[21] Appl. No.: 596,743

[22] Filed: Feb. 5, 1996

[30] Foreign Application Priority Data

Feb. 28, 1995 [KR] Rep. of Korea .................. 95-4002

[51] Int. Cl.⁶ ........................................... H01L 21/8247
[52] U.S. Cl. ............................ 437/43; 437/50; 437/191
[58] Field of Search ........................... 437/43, 44, 49, 437/50, 984, 191

[56] References Cited

U.S. PATENT DOCUMENTS

| 4,861,730 | 8/1989 | Hsia et al. | 437/43 |
| 5,008,212 | 4/1991 | Chen | 437/43 |
| 5,280,446 | 1/1994 | Ma et al. | 257/316 |
| 5,429,969 | 7/1995 | Chang | 437/191 |
| 5,494,838 | 2/1996 | Chang et al. | 437/43 |

*Primary Examiner*—Chandra Chaudhari
*Attorney, Agent, or Firm*—Fish & Richardson P.C.

[57] ABSTRACT

A method of manufacturing a flash EEPROM cell with a split-gate structure which can improve the electrical characteristics of the cell by forming a source region through an ion implantation method using a select gate as a mask to prevent the reduction in the electrical characteristics of a gate oxide layer is disclosed.

4 Claims, 4 Drawing Sheets

(PRIOR ART) FIG. 1
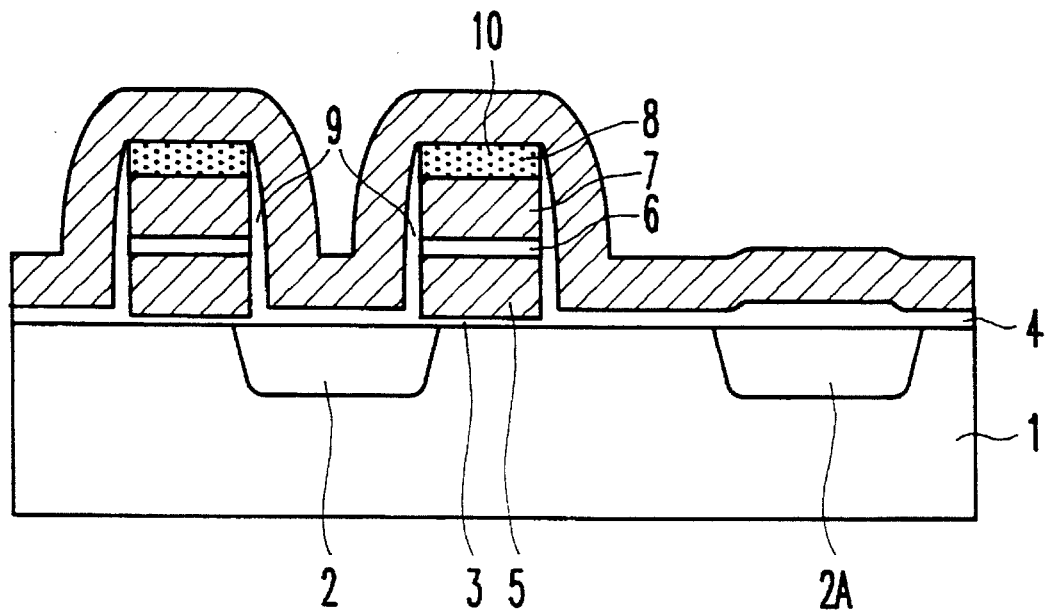
FIG. 2A
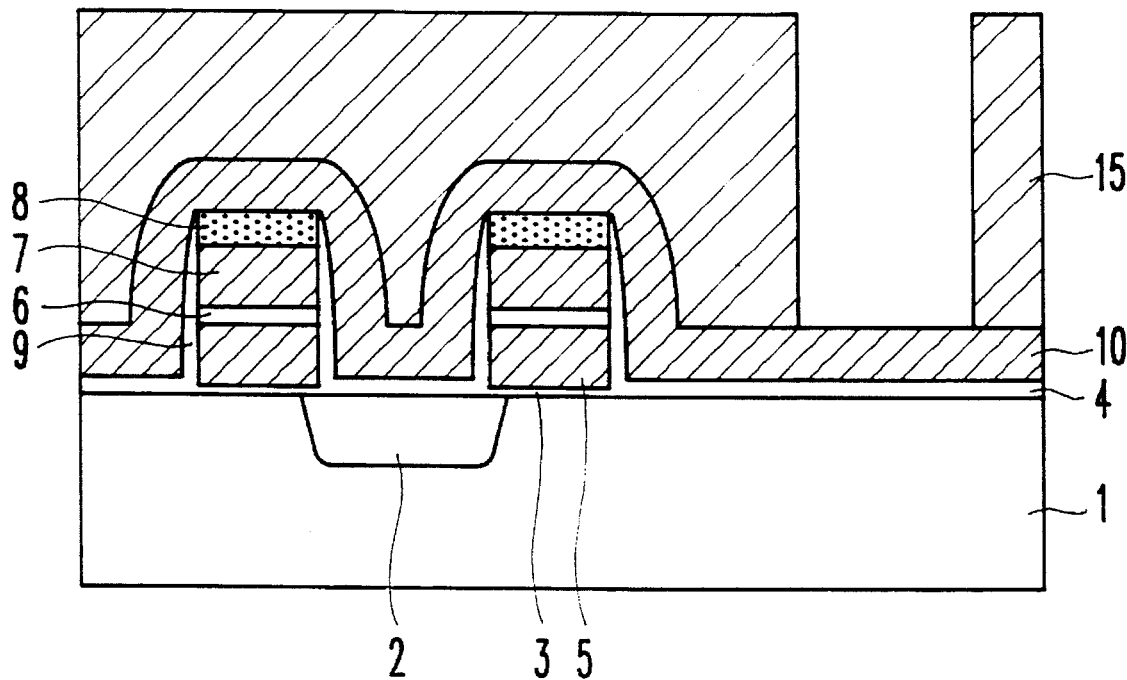

METHOD OF MANUFACTURING A FLASH EEPROM CELL USING THE SELECT GATES AS A MASK

FIELD OF THE INVENTION

This invention relates to a method of manufacturing a flash EEPROM cell, and more particularly to a method of manufacturing a flash EEPROM cell which can improve the electrical characteristics of the flash EEPROM cell by forming a source region of the cell through an ion implantation method using select gates as a mask to manufacture a flash EEPROM cell with a split-gate structure.

INFORMATION DISCLOSURE STATEMENT

Generally, a flash EEPROM cell with an electrical program function and an erasure function is classified as having either a stack-gate structure or a split-gate structure.

A conventional flash EEPROM cell with a split-gate structure is shown in FIG. 1. As shown in FIG. 1, two gate electrodes with a tunnel oxide layer 3, a floating gate 5, a dielectric layer 6, a program gate 7 and an insulting layer 8 which are formed in stack-structure are formed on the silicon substrate 1. A source and drain regions 2A and 2 are formed in the silicon substrate 1 through an ion implantation process. A side wall insulating layer 9 is then formed on the side walls of the two gate electrodes. A select gate oxide layer 4 is formed on the exposed portions of the silicon substrate. A polysilicon layer 10 is formed on the resulting structure after the select gate oxide layer 4 is formed. A select gate is formed by patterning the polysilicon layer 10, thereby forming a flash EEPROM cell with a split-gate structure. The flash EEPROM cell formed by the above processes cause the electric characteristic of the select gate oxide layer 4 to deteriorate due to the formation of the source region 2A before the formation of the select gate oxide layer 4. Also, the select gate is formed on the source and drain regions 2A and 2, thereby forming a parasitic capacitor. Accordingly, the operational speed of the flash EEPROM cell is reduced due to the parasitic capacitor.

SUMMARY OF THE INVENTION

Therefore, it is an object of the invention to provide a method of manufacturing a flash EEPROM cell which can solve the above problems by forming a source region of a flash EEPROM cell with a split-gate structure through an ion implantation method using a select gate as a mask.

To accomplish the above object, a method of manufacturing a flash EEPROM cell according to the invention comprises the steps of: sequentially forming a tunnel oxide layer, a floating gate, an dielectric layer, a program gate and an insulating layer on a silicon substrate, thereby forming a gate electrode; forming a drain region in the silicon substrate of a side wall of the gate electrode; forming a side wall insulating layer on the side wall of the gate electrode; forming a select gate oxide layer on an exposed portion of the silicon substrate; forming a polysilicon layer on the resulting structure after forming the select gate oxide layer; patterning the polysilicon layer so that a portion of the select gate oxide layer is exposed, thereby forming a select gate; forming a source region in a selected portion of the silicon substrate; sequentially depositing a oxide layer and a BPSG layer after forming the source region; exposing a portion of the select gate, thereby forming a contact hole; and forming a word line on the resulting structure after forming the contact hole.

BRIEF DESCRIPTION OF THE DRAWINGS

For fuller understanding of the nature and objects of the invention, reference should be made to the following detailed description and the accompanying drawings in which:

FIG. 1 is a sectional view of a conventional flash EEPROM cell.

FIG. 2A through 2E are sectional views of illustrating a method of manufacturing a flash EEPROM cell according to the present invention.

Similar reference characters refer to similar parts in the several views of the drawings.

DETAILED DESCRIPTION OF THE INVENTION

Figure 2B:
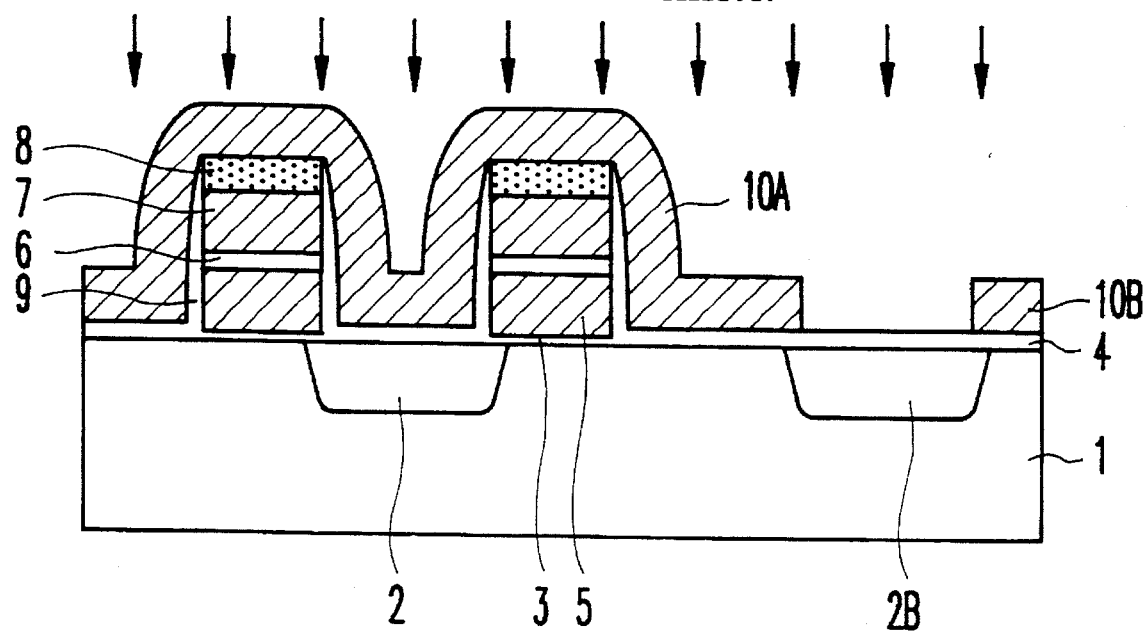

FIG. 2A through 2E are sectional views illustrating a method of manufacturing a flash EEPROM cell according to the invention. The present invention will be explained with reference to FIG. 3.

Referring to FIG. 2A, a tunnel oxide layer 3, a floating gate 5, a dielectric layer 6, a program gate 7 and an insulating layer 8 are sequentially formed on each selected portion of a silicon substrate 1, thereby forming two gate electrodes. A drain region 2 is formed in the silicon substrate 1 between two gate electrodes through an ion implantation process. Side wall insulating layers 9 are then formed on the side walls of the two gate electrodes. A select gate oxide layer 4 is formed on exposed portions of the silicon substrate 1. A polysilicon layer 10 is formed on the resulting structure after forming the select gate oxide layer 4. A first photoresist pattern 15 is then formed on the polysilicon layer 10. In the above process the side wall oxide layer 9 is formed in a ONO structure which is sequentially formed with an oxide layer, a nitride layer and an oxide layer.

With reference to FIG. 2B, a portion of the polysilicon 10 exposed by the photoresist pattern 15 is removed by an etching process, thereby forming a first and second select gates 10A and 10B. The first and second select gates 10A and 10B are isolated respectively. The first photoresist pattern 15 is removed and a source region 2B is then formed in the silicon substrate 1 through an ion implantation method using the first and second select gates 10A and 10B as masks.

Figure 2C:
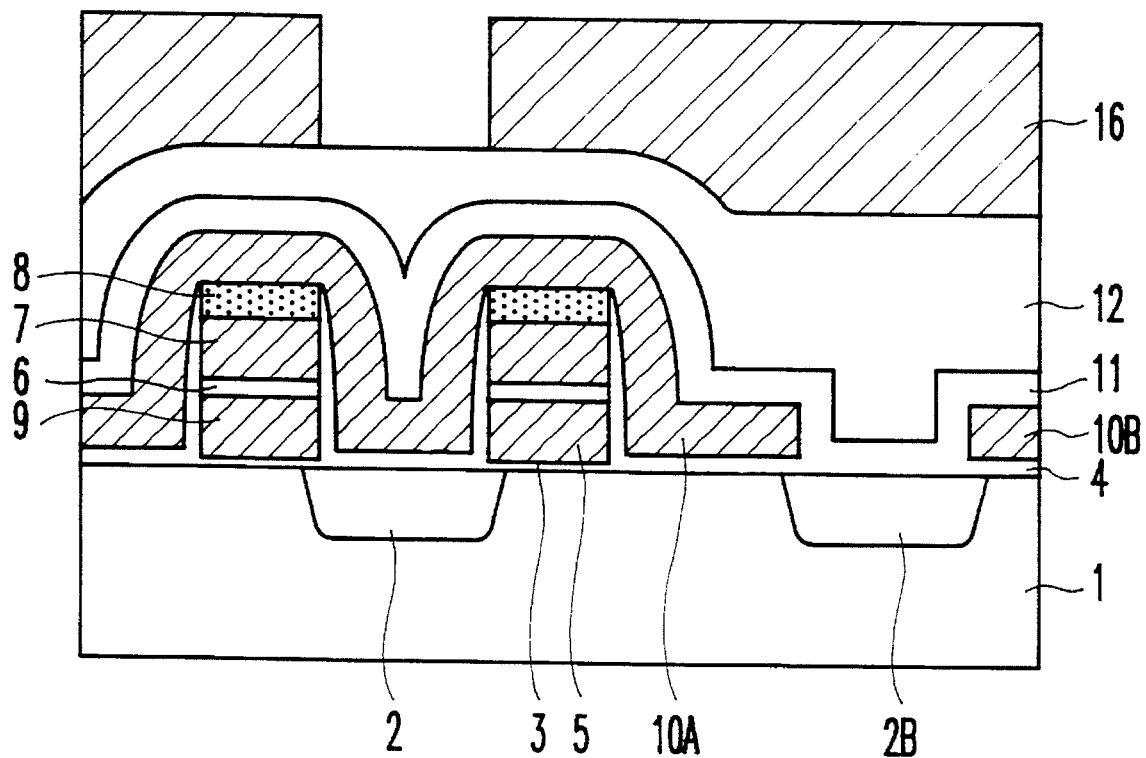

As shown in FIG. 2C, an oxide layer 11 is formed on the resulting structure after forming the source region 2B and a Boron Phosphorous Silicate Glass(BPSG) layer 12 is then formed on the oxide layer 11. The BPSG layer 12 is planarized and a second photoresist pattern 16 is formed on the BPSG layer 12.

Figure 2D:
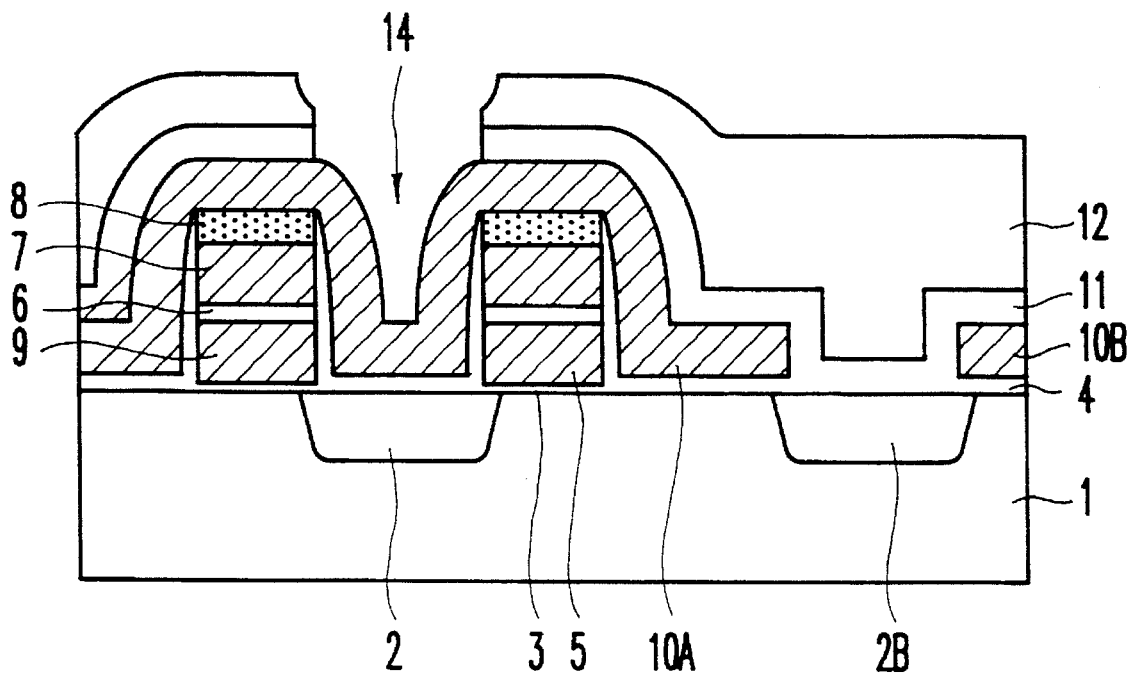

Referring to FIG. 2D, a portion of the BPSG layer 12 and the oxide layer 11 exposed by the second photoresist pattern 16 are sequentially etched, thereby forming a contact hole 14. The second photoresist pattern 16 is then removed.

Figure 2E:
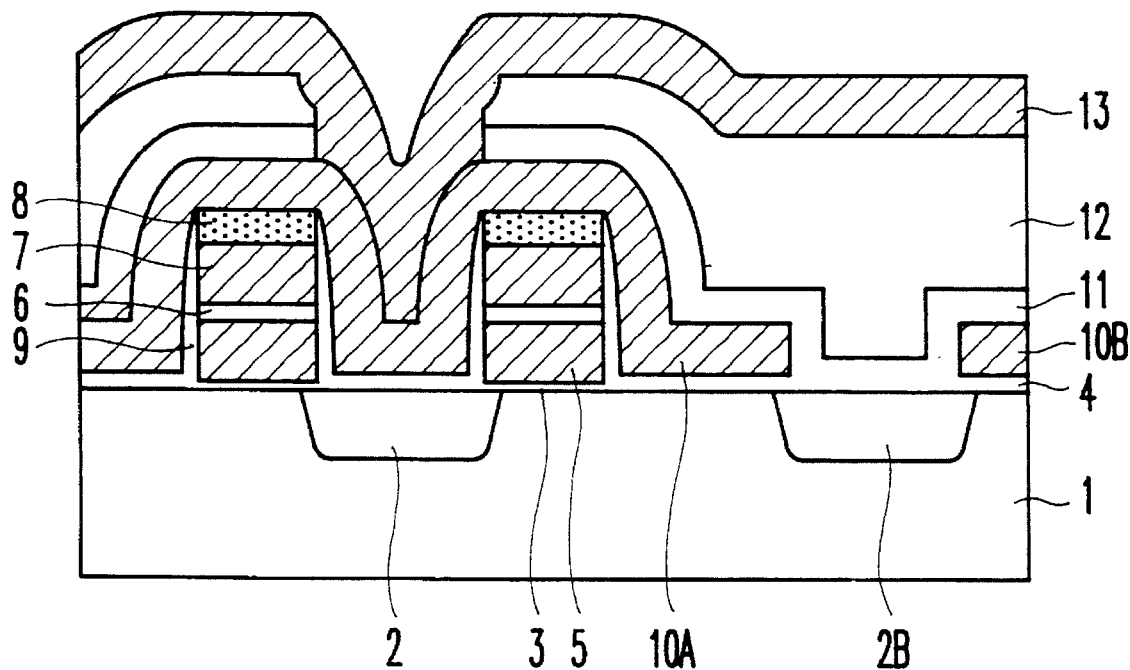
Figure 3:
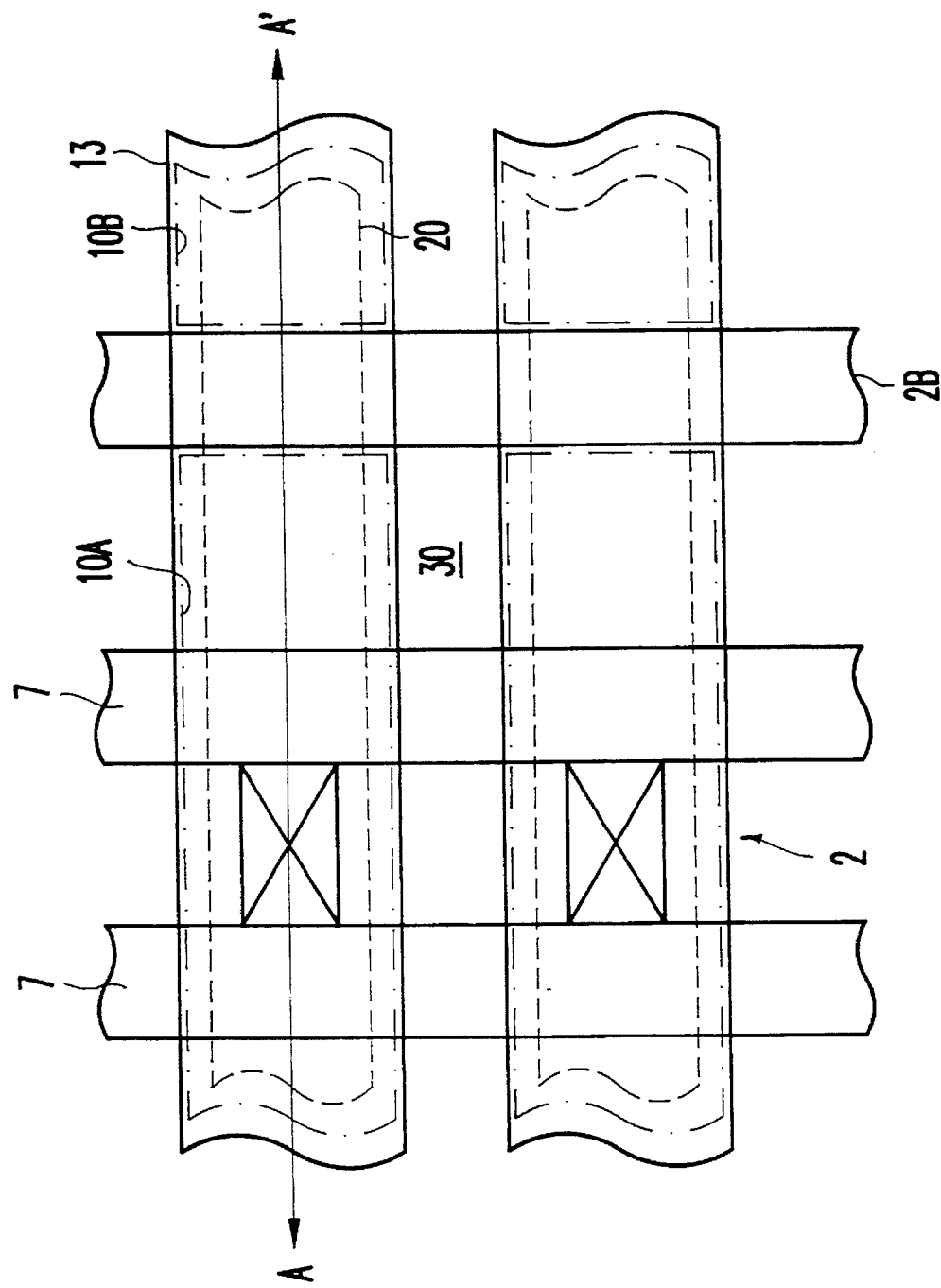
FIG. 3 is a lay-out of FIG. 2E.

Referring to FIG. 2E, a word line 13 is formed by depositing polysilicon, polycide or metal on the resulting structure after forming the contact hole 14, thereby interconnecting the first and second select gates 10A and 10B. FIG. 2E is a sectional view along line A–A' of FIG. 3. In FIG. 3, reference number 20 denotes an active region and reference number 30 denotes a field region.

As described above, according to the present invention, since a word line is made of polycide and a select gate is formed with polysilicon, the electrical characteristics of the select gate oxide layer are improved. Also, since a source region is formed through an ion implantation method using select gates as masks, the cell off leakage current of a select transistor is decreased.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of manufacturing a flash EEPROM cell, comprising the steps of:

sequentially forming a tunnel oxide layer, a floating gate, a dielectric layer, a program gate and an insulating layer on a silicon substrate, thereby forming a gate electrode;

forming a drain region in said silicon substrate of a side of said gate electrode;

forming a side wall insulating layer on the side wall of said gate electrode;

forming a select gate oxide layer on an exposed portion of said silicon substrate;

forming a polysilicon layer on the resulting structure after forming said select gate oxide layer;

patterning said polysilicon layer so that a portion of said select gate oxide layer is exposed, thereby forming a select gate;

forming a source region in a selected portion of said silicon substrate;

sequentially depositing an oxide layer and a BPSG layer after forming said source region;

exposing a portion of said select gate, thereby forming a contact hole; and forming a word line on the resulting structure after forming said contact hole.

2. The method of claim 1, wherein said side wall insulating layer is formed in ONO structure.

3. The method of claim 1, wherein said word line is formed with any one of polysilicon, polycide or metal.

4. The method of claim 1, wherein said source region is formed by an ion implantation method using said select gate as a mask.

* * * * *